US 6,670,699 B2

(12) United States Patent
Mikubo et al.

(10) Patent No.: US 6,670,699 B2
(45) Date of Patent: Dec. 30, 2003

(54) SEMICONDUCTOR DEVICE PACKAGING STRUCTURE

(75) Inventors: Kazuyuki Mikubo, Tokyo (JP); Sakae Kitajo, Tokyo (JP); Yuzo Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 10/090,459

(22) Filed: Mar. 4, 2002

(65) Prior Publication Data
US 2002/0185718 A1 Dec. 12, 2002

(30) Foreign Application Priority Data

Mar. 13, 2001 (JP) .......................... 2001-070889

(51) Int. Cl.[7] .............................................. H01L 23/02
(52) U.S. Cl. ........................................ 257/678; 257/706
(58) Field of Search ................................. 257/678, 703, 257/713; 361/388, 704; 29/840; 165/804

(56) References Cited

U.S. PATENT DOCUMENTS

| 4,860,165 | A | * | 8/1989 | Cassinelli ................... 361/388 |
| 5,986,885 | A | * | 11/1999 | Wyland ....................... 361/704 |
| 6,032,355 | A | * | 3/2000 | Tseng et al. ................... 29/840 |
| 6,122,171 | A | * | 9/2000 | Akram et al. ................ 361/704 |
| 6,219,243 | B1 | * | 4/2001 | Ma et al. ...................... 361/704 |
| 6,257,320 | B1 | * | 7/2001 | Wargo ........................ 165/80.4 |
| 6,323,549 | B1 | * | 11/2001 | deRochemont et al. ..... 257/703 |
| 6,388,317 | B1 | * | 5/2002 | Reese ......................... 257/713 |

FOREIGN PATENT DOCUMENTS

| JP | 2000-150714 | 5/2000 |
| JP | 2000-150715 | 5/2000 |
| JP | 2000-260901 | 9/2000 |

OTHER PUBLICATIONS

Murano, H. et al., "Packaging and Cooling Technology for the SX System", NEC Journal, Computer Engineering Division, vol. 39, No. 1/1986.

* cited by examiner

Primary Examiner—David Nelms
Assistant Examiner—Thinh T. Nguyen
(74) Attorney, Agent, or Firm—Choate, Hall & Stewart

(57) ABSTRACT

A semiconductor package comprising an LSI chip, a chip bump, an interposer, and a BGA bump is mounted at a predetermined position of a printed wiring board having a core layer. A heat sink for dissipating heat generated from the LSI chip is installed within the core layer. Further, heat radiating vias for conveying heat generated from the LSI chip to the heat sink are provided within the printed wiring board so that the BGA bump in the LSI chip is thermally liked with the heat sink. The heat generated from the LSI chip is mainly dissipated through a route of chip bump→interposer→BGA bump→heat radiating via→heat sink. By virtue of the above construction, the semiconductor device packaging structure can reduce the packaging volume of the heat sink while providing satisfactory cooling capacity and, at the same time, can minimize the length of signal wiring between LSI chips.

23 Claims, 12 Drawing Sheets

SEMICONDUCTOR DEVICE PACKAGING STRUCTURE

FIELD OF THE INVENTION

The invention relates to a semiconductor device packaging structure, and particularly to a semiconductor device packaging structure which can minimize wiring length between semiconductor packages to realize high speed operation of electronic equipment and, at the same time, can realize a reduction in size and a reduction in thickness of electronic equipment.

BACKGROUND OF THE INVENTION

In recent years, high speed processing of an enormous amount of information has become required of digital equipment ranging from personal computers used in the Internet and the like to large-sized computers used in technological calculations on a global scale, and there is an ever-increasing demand for an increase in processing speed of the digital equipment. One conventional method for increasing the processing speed is to minimize a signal wiring distance between mounted LSI chips to realize high density packaging which increases propagation speed of signals. Further, there is a trend toward a rapid increase in operation frequency of microprocessors (hereinafter referred to as "CPU"), which is the nucleus of digital equipment, and, for example, digital equipment of which the frequency of CPU reaches 1.5 GHz has been reported. An increase in operation frequency of CPU and, at the same time, the use of an enormous number of semiconductor devices have led to a rapid increase in heat generation. For example, in the case of CPU having an operation frequency of 1.5 GHz, the maximum power consumption amounts to about 70 W, and this heat generation is causative of the hinder of an increase in processing speed. The following semiconductor device has hitherto been proposed as a solution to the above problem of heat generation.

FIG. 1 shows the construction of a conventional semiconductor device packaging structure.

This semiconductor device packaging structure is presently adopted in various types of electronic equipment such as computers and switching systems.

A chip bump 2 provided on one side of a flip chip-type LSI chip 1 is connected to the surface of an electrode on the top surface of an interposer 3. The interposer 3 has on its under surface a BGA (ball grid array) bump 4. This BGA bump 4 is connected to a printed wiring board 6 in its pad. A gap between the LSI chip 1 and the interposer 3 is filled with an underfill resin 5 to prevent a thermal expansion coefficient mismatch between the LSI chip 1 and the interposer 3. These portions are called a semiconductor package and are connected to the printed wiring board 6 through the BGA bump 4. Signal wirings 7 are provided so as to form a multilayer structure within the printed wiring board 6, and, in addition, throughholes 50 are provided for connecting the upper wiring layer to the lower wiring layer.

Since the LSI chip 1 generates a significant level of heat during operation, a heat radiator 70 is mounted on the heat radiating surface of the LSI chip 1. When the adhesion between the heat radiator 70 and the LSI chip 1 in its heat radiating surface is poor, the heat radiation is unsatisfactory. When the heat radiation is unsatisfactory, the LSI chip 1 cannot exhibit the original performance and this affects the operation at a high speed and reliability. Accordingly, a method is adopted wherein a heat conductive adhesive 31 is coated on the backside (top surface in the drawing) of the LSI chip 1 to improve heat conduction between the LSI chip 1 in its heat radiating surface and the heat radiator 70, whereby the LSI chip 1 is controlled at a tolerance upper limit temperature or below. The heat radiator 70 comprises a plurality of heat radiating fins 71 which are provided upright at predetermined intervals. This heat radiating fins 71 are forcibly air cooled by blowing the wind produced by a cooling fan (not shown) against the heat radiating fins 71.

"NEC Giho," Vol. 39, No. 1 (1986), pp 36–41 discloses a cooling technique for supercomputers. According to this technique, a plurality of LSIs are two-dimensionally provided on a ceramic substrate, and a columnar heat radiating stud is provided on each LSI. These heat radiating studs are interposed in heat-conductive blocks, and a cooling water passage is provided on the surface of the heat-conductive blocks to perform cooling. According to this cooling technique, a quantity of generated heat of 40 W per LSI can be tolerated, that is, some effect can be attained.

Further, Japanese Patent Laid-Open Nos. 150714/2000, 150715/2000, and 260901/2000 propose semiconductor plastic packages for high density packaging of multiterminal semiconductor plastic packages of which the power consumption is relatively large, such as microprocessors and ASICs (application specific integrated circuits). In these semiconductor plastic packages, the following means is provided to cope with an improvement in function of LSI chips and with an increase in the quantity of generation of heat involved in increased density of packaging: means for disposing, at the center of an interposer in its thicknesswise direction, a metallic plate having substantially the same size as an interposer; means for fixing an LSI chip onto one side of the interposer with the aid of a heat-conductive adhesive; means for insulating the metallic plate from a circuit provided on the surface through a heat-curable resin composition; means for connecting the circuit conductor provided on the interposer to the LSI chip by wire bonding; means for connecting, through a throughhole conductor insulated by a metallic plate and a resin composition, a signal propagation circuit conductor on a printed wiring board to a circuit conductor or a connection conductor pad provided on the printed wiring board in its side remote from the signal propagation circuit conductor; means for sealing the semiconductor chip, the wire, and the bonding pad with a resin; and the like. In these publications, the material for the metallic plate for heat radiation is not particularly limited. However, materials, which have a high modulus of elasticity and a high coefficient of thermal conductivity and a thickness of 30 to 500 μm, are described to be suitable, and pure copper, oxygen free copper and the like are specifically disclosed.

According to the conventional semiconductor packaging structures, however, in the case of the semiconductor device shown in FIG. 1, the volume occupied by the heat radiator 70 is large. Therefore, the spacing between adjacently mounted LSI chips is long. This necessitates the provision of long signal wiring, which causes attenuation or delay of transmitted signals, and thus cannot cope with a demand for an increase in processing speed in the future. Further, the fact that the occupied volume of the heat radiator 70 is large, means that the above device cannot meet the demand for a reduction in size and a reduction in thickness in advanced electronic equipment.

Further, in the technique described in "NEC Giho," Vol. 39, since the size of the water cooling mechanism is large, the packaging volume cannot be reduced. Therefore, the technique described in "NEC Giho," Vol. 39 also involves the above problem. Further, according to Japanese Patent Laid-Open Nos. 150714/2000, 150715/2000, and 260901/2000, in recent years, many LSI chips, of which the number of terminals exceeds 1000 pins, appear, and an improvement in function would lead to a demand for a further increased number of pins in the future. In the case of the structure wherein the metallic plate is embedded in the whole area within the interposer, this is considered to pose a problem associated with housing of signal wiring and an increase in size of package.

SUMMARY OF THE INVENTION

Accordingly, it is an object of the invention to provide a semiconductor device packaging structure which can reduce the mounting volume of a heat sink while providing satisfactory cooling capacity and, at the same time, can minimize the length of signal wiring between LSI chips.

According to the first feature of the invention, a semiconductor device packaging structure comprises: a printed wiring board having mautilayered wirings; and a semiconductor chip mounted at a predetermined position of the printed wiring board, wherein the printed wiring board is provided with a heat sink at a site remote from the semiconductor chip, and wherein a plurality of metallic columns, which contact the heat sink and a metallic portion on the semiconductor chip side to perform heat link, are built in the printed wiring board.

According to this structure, packaging of a heat sink within a printed wiring board can reduce the space of the heat sink, which occupies the semiconductor device, and, in addition, can reduce spacing between adjacent semiconductor chips. Further, in this case, heat is conveyed from the semiconductor chip to the heat sink through a plurality of metallic columns provided within the printed wiring board. The metallic columns are a minute object and thus have substantially no effect on drawing of wirings or the number of wirings provided within the printed wiring board. Therefore, unlike the conventional construction wherein, due to the mounting of a large heat sink, mutual spacing between semiconductor chips on the printed wiring board is large resulting in large signal wiring length, according to the invention, the signal wiring length between semiconductor chips can be reduced and, thus, attenuation or delay time in the signal transmission can be reduced.

According to the second feature of the invention, a semiconductor device packaging structure comprises: a printed wiring board having mautilayered wirings; and a semiconductor chip mounted at a predetermined position of the printed wiring board, wherein the printed wiring board is provided with a heat sink at a site remote from the semiconductor chip and has a concave portion for exposing the heat sink, and wherein the semiconductor chip is mounted within the concave portion in such a state that the heat radiating surface of the semiconductor chip is in close contact with the heat sink.

According to this structure, a heat sink is provided within a printed wiring board. This can reduce the space of the heat sink, which occupies the semiconductor device, and, in addition, can reduce the space between adjacent semiconductor chips. Further, a concave portion (an opening portion) is provided in the printed wiring board so as to face the heat sink, and the semiconductor chip can be directly mounted on the heat sink. Therefore, unlike the conventional construction wherein, due to the mounting of a large heat sink, mutual spacing between semiconductor chips on the printed wiring board is large resulting in large signal wiring length, according to the invention, the signal wiring length between semiconductor chips can be reduced and, thus, attenuation or delay time in the signal transmission can be reduced.

According to the third feature of the invention, a semiconductor device packaging structure comprising: a printed wiring board having mautilayered wirings; and a semiconductor chip mounted at a predetermined position of the printed wiring board, wherein a heat sink having in its interior at least one passage for passing a cooling medium therethrough is mounted on the heat radiating surface of the semiconductor chip.

According to this structure, the heat sink permits a cooling medium to be passed therethrough to enhance the heat change efficiency. This can realize a reduction in size. This heat sink is mounted directly on the surface of the semiconductor chip. Therefore, unlike the conventional construction wherein, due to the mounting of a large heat sink, mutual spacing between semiconductor chips on the printed wiring board is large resulting in large signal wiring length, according to the invention, the signal wiring length between semiconductor chips can be reduced and, thus, attenuation or delay time in the signal transmission can be reduced.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

[First preferred embodiment]

Figure 2:
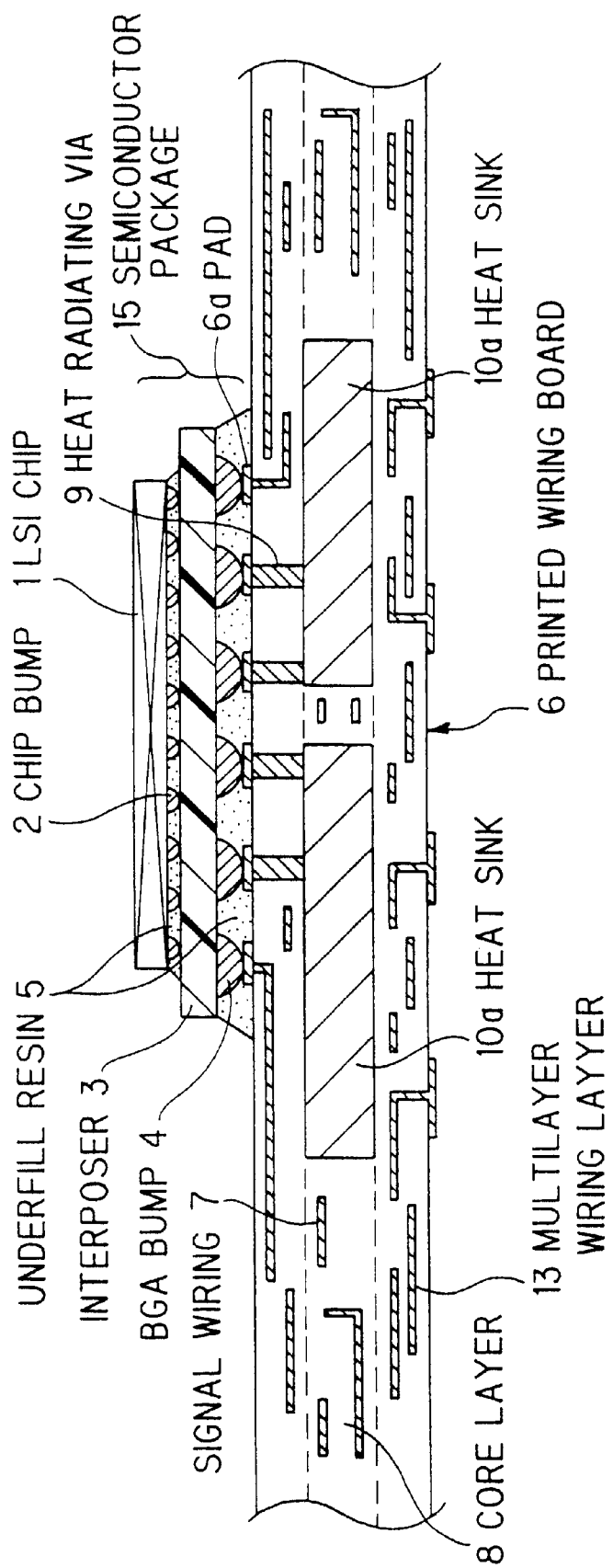
FIG. 2 is a cross-sectional view showing a first preferred embodiment of the semiconductor device packaging structure according to the invention.

FIG. 2 shows a first preferred embodiment of the semiconductor device packaging structure according to the invention.

A chip bump 2 is mounted on an electrode pad (not shown) in a flip chip-type LSI chip 1. This chip bump 2 is connected to an interposer 3 in its connection pad. Further, a gap between the LSI chip 1 and the interposer 3 is filled with an underfill resin 5 to form a semiconductor package 15. This semiconductor package is connected to a printed wiring board 6 through BGA balls 4 provided on the underside of the interposer 3. The BGA balls 4 are connected by soldering to pads 6a provided on the printed wiring board 6. After this connection, the peripheral portion of the BGA balls 4 is filled with the underfill resin 5.

In addition to a signal wiring 7, a heat sink plate 10a is embedded in the printed wiring board 6 in its core layer 8, and, further, multilayered wiring layers 13 (comprising a copper foil pattern of signal wirings or the like) are provided on both sides of the core layer 8. The signal wiring 7 is not provided in a portion, in which the heat sink 10a has been embedded, and is provided around the heat sink 10a and above and below the heat sink 10a. The heat sink 10a is formed of a metal material having a high coefficient of thermal conductivity, for example, copper or aluminum. The heat sink 10a is provided with heat radiating vias 9 (metallic columns) so as to be selectively connected to the BGA bumps 4 having a ground (GND) potential (or a power supply Vcc potential). The heat radiating vias 9 function as a heat conducting member. Therefore, although solder may be used, the use of a highly heat conductive metal, such as copper or aluminum, is preferred.

In the above structure, heat generated from the LSI chip 1 is conveyed through a route of LSI chip 1→chip bump 2→interposer 3→BGA bump 4→printed wiring board 6. Further, the heat, which has arrived at the printed wiring board 6, is conducted to the heat sink 10a through heat radiating vias 9, which have been selectively provided within the printed wiring board 6, is diffused into the copper foil pattern (wiring) and the like within the printed wiring board 6, and is then dissipated into the air. Thus, according to the first preferred embodiment of the invention, unlike the conventional semiconductor device packaging structure shown in FIG. 1, a structure is adopted wherein the heat sink is provided within the packaging structure rather than the outside of the packaging structure to improve the thermal conduction. By virtue of this structure, excellent cooling capacity can be realized. This can reduce power consumption of the LSI chip 1. Further, since a reduction in size and a reduction in thickness can be realized, this structure is suitable for utilization in electronic equipment such as portable terminals which require high density packaging. Further, the heat sink 10a and the signal wirings are simultaneously formed within the core layer 8 in the printed wiring board 6. Therefore, an increase in density of packaging can be realized without sacrificing the capacity of wiring accommodation.

Figure 1:
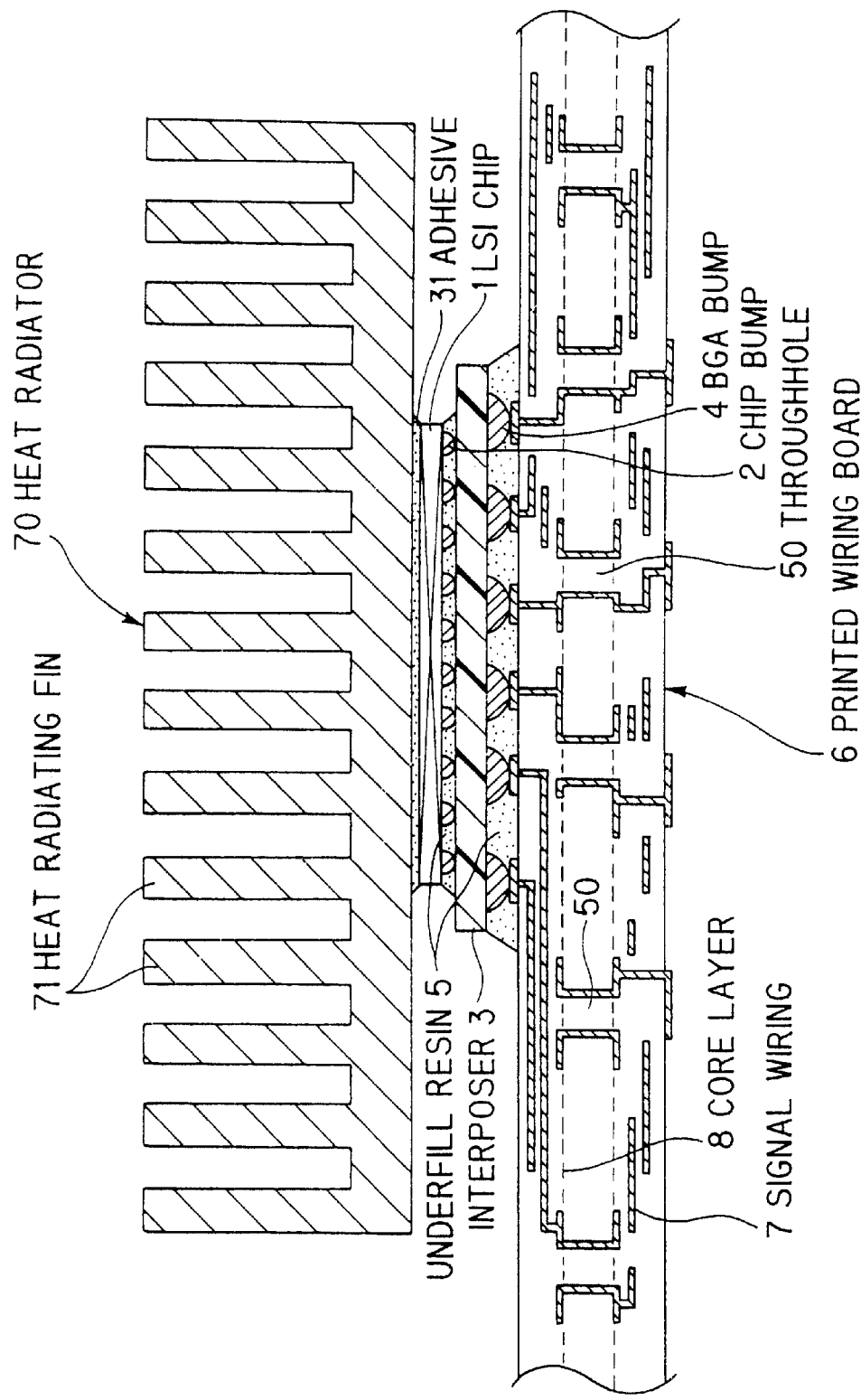
FIG. 1 is a cross-sectional view of a conventional semiconductor device packaging structure.

In FIG. 2, the heat sink 10a is embedded in the printed wiring board 6 and is not exposed to the outside of the printed wiring board at all. Alternatively, the heat sink 10a may be embedded so as to be projected outside the printed wiring board 6. Exposure of the heat sink 10a to the air can enhance heat radiation effect. Further, a motor fan or the heat radiator as shown in FIG. 1 may be mounted on the outside projected portion.

[Second preferred embodiment]

Figure 3:
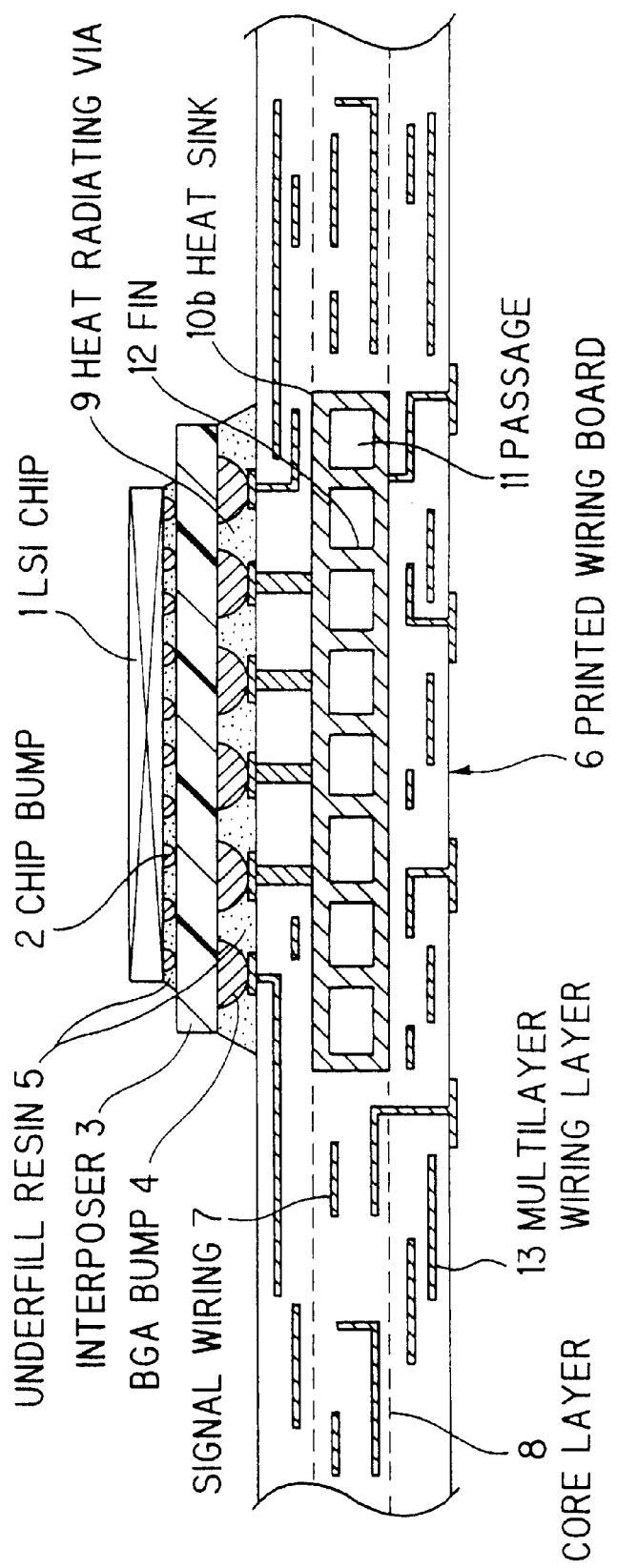
FIG. 3 is a cross-sectional view showing a second preferred embodiment of the semiconductor device packaging structure according to the invention.
Figure 4:
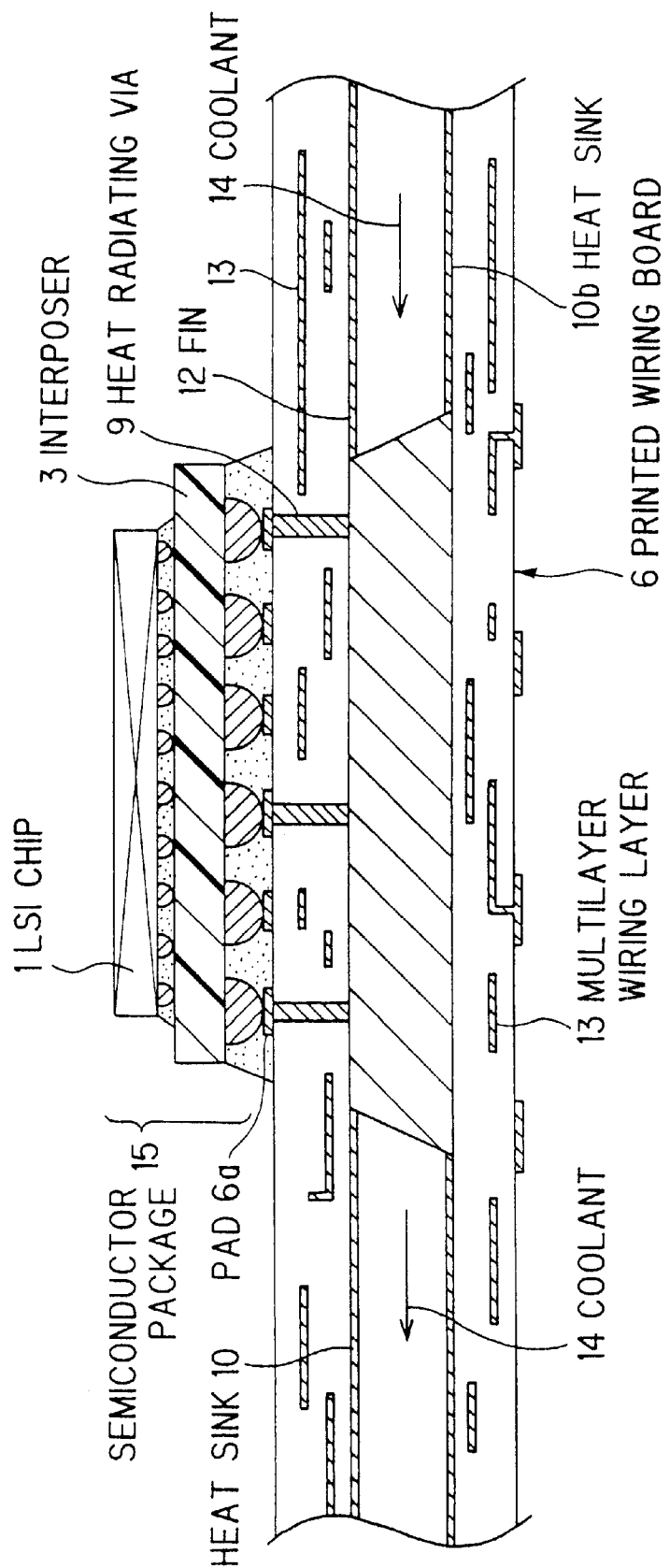
FIG. 4 is a transverse sectional view of the semiconductor device packaging structure in the second preferred embodiment shown in FIG. 3.

FIGS. 3 and 4 show a second preferred embodiment of the invention, wherein FIG. 3 is a sectional view as viewed from the front direction and FIG. 4 a sectional view as viewed from the transverse direction. In FIGS. 2, 3, and 4, like members or elements having like functions are identified with the same reference numerals.

This preferred embodiment has the same construction as the first preferred embodiment shown in FIG. 2, except that a heat sink 10b having a hollow structure with flow passages 11 partitioned by fins 12 being incorporated therein is used instead of the heat sink plate 10a shown in FIG. 2. The heat sink 10b is formed of a highly heat-conductive metal material, for example, copper or aluminum. The passages 11 are provided in a width of 0.2 to 0.6 mm, and, as shown in FIG. 4, a coolant 14 (a cooling medium) is fed into the hollow portion by mean of a cooling pump (not shown). One end of the heat radiating via 9 is connected to the top (surface) of the heat sink 10b, and the other end thereof leads to a pad for connection to a semiconductor package 15 on the printed wiring board 6. In the provision of the heat radiating vias 9, either GND potential or Vcc potential is selected. In this preferred embodiment, only one semiconductor package 15 is provided on the printed wiring board 6. The invention, however, can also be applied to a multi-chip module construction wherein a plurality of semiconductor packages 15 are mounted.

In FIGS. 3 and 4, LSI chip 1 packaged at a high density generates a large quantity of heat for consuming large electric power. Since the coefficient of thermal conductivity of the coolant, which flows through the passage within the heat sink 10b, is much larger than that of other heat conduction forms, most of the heat generated in this LSI chip 1 is conducted through a route of LSI chip 1→chip bump 2→interposer 3→BGA bump 4→printed wiring board 6. The heat is then conducted through the heat radiating vias 9 to the heat sink lob, reaches the coolant 14 within the passages 11 provided within the heat sink 10b, followed by heat exchange. The use of a liquid, such as water, as the coolant 14 can significantly improve heat radiation performance over other coolants such as gases. When the passage 11 is longer than the size of the LSI chip 1, the area of contact between the heat and the coolant, which flows through the passage 11 is increased, contributing to efficient heat exchange.

Here the cooling performance of the heat sink 10b will be explained.

The larger the number of passages 11 provided within the heat sink 10b, the larger the area of contact between the coolant 14 and the fins 12 and, consequently, the smaller the heat resistance. A larger number of passages 11, however, results in a higher pressure loss within the passages 11. For this reason, the number of passages 11 should be determined by the capacity of the cooling pump used. Accordingly, in consideration of the performance of the cooling pump, the relationship between the heat resistance of the LSI chip 1 and the pressure loss within the passage 11 was determined by the following theoretical equation.

First, regarding boundary conditions around the semiconductor device according to the invention, it is assumed that the environment temperature is room temperature, the wind velocity is natural convection, and the coolant 14 is water. The present inventors have confirmed by experimentation that, under these boundary conditions, the coefficient of thermal conductivity of the coolant 14 (water in this preferred embodiment), which flows through the passage 11, is much larger than other heat conduction forms. Since most of the heat generated in the LSI chip 1 is conducted to the coolant 14, the heat resistance of the LSI chip 1 was calculated based on the assumption that the dissipation of heat from the surface of the LSI chip 1 and the surface and side of the printed wiring board 6 is negligible.

At the outset, the method for calculating the heat resistance (Rtot) of the LSI chip 1 will be explained. The heat resistance (Rtot) of the LSI chip 1 can be expressed as the sum (the following equation) of the heat resistance of the LSI chip 1 per se (Rchip), the heat resistance of the chip bump 2 (Rcbmp), the heat resistance of the interposer 3 (Rip), the heat resistance of the BGA bump 4 (Rbga), the heat resistance of the heat radiating vias 9 (Rtvia), and the heat resistance of the heat sink 10b (Rfin).

$$Rtot = Rchip + Rcbmp + Rip + Rbga + Rtvia + Rfin$$

Next, the calculation of heat resistance derived from heat conduction will be explained. The heat resistance derived from heat conduction of the heat resistance of the LSI chip 1 per se (Rchip), the heat resistance of the chip bump 2 (Rcbmp), the heat resistance of the interposer 3 (Rip), the heat resistance of the BGA bump 4 (Rbga), and the heat resistance of the heat radiating vias 9 (Rtvia) can be expressed by the following fundamental equation (1).

$$R^{***} = t/\lambda A \quad (1)$$

wherein t: thickness of member, $\lambda$: coefficient of thermal conductivity of the member, and A: area of heat source.

In the calculation of the heat resistance (Rchip) of the LSI chip 1 per se, for example, coefficient of thermal conductivity $\lambda$ of silicon (Si) may be used as the coefficient of the thermal conduction of the member, and chip size A may be used as the area of heat source. Therefore, the heat resistance can be determined by the substitution of these data and the chip thickness t in equation (1).

Next, in the calculation of the heat resistance (Rcbmp) in the chip bump 2, for the thickness (height t) and the area A of the heat source of the chip bump 2, the same values as in the LSI chip 1 are used. On the other hand, the coefficient of thermal conductivity $\lambda$ of the member is determined as an average coefficient of thermal conductivity ($\lambda$cbmp.av) from the area ratio of the chip bump 2 and the area ratio of the underfill resin 5 by the following equation (2). The substitution of the average coefficient of thermal conductivity ($\lambda$cbmp.av) in the equation (1) can give the heat resistance (Rcbmp) of the chip bump 2.

$$\lambda cbmp.av = \alpha cbmp \cdot \lambda cbmp + \alpha file \cdot \lambda file \quad (2)$$

wherein $\alpha$cbmp: occupation ratio of chip bump, $\lambda$cbmp: coefficient of thermal conductivity of chip bump, $\alpha$file: occupation ratio of underfill resin 5, and $\lambda$file: coefficient of thermal conductivity of underfill resin 5.

Next, in the calculation of the heat resistance (Rip) of the interposer 3, for the thickness t of the interposer and the area A of the heat source, the same values as in the LSI chip 1 and the chip bump 2 are used. In general, however, the construction of the interposer 3 is actually such that the insulating layer (such as FR4) and the connection pad or the conductor layer (such as copper foil) of signal outgoing wiring and the like are stacked on top of each other. Therefore, when the heat resistance (Rip) of the interposer 3 having an integrated structure of the above layers is determined, the occupation ratio of the insulating layer and the occupation ratio of the conductor layer are first determined for each layer, followed by the determination of the average coefficient of thermal conductivity ($\lambda$layerN.av) for each layer by equation (3).

$$\lambda layerN.av = \alpha Cu \cdot \lambda Cu + \alpha FR4 \cdot \lambda FR4 \quad (3)$$

wherein $\alpha$Cu: occupation ratio of conductor, $\lambda$Cu: coefficient of thermal conductivity of conductor, $\alpha$FR4: occupation ratio of insulator, and $\lambda$FR4: coefficient of thermal conductivity of insulator.

Since the average coefficient of thermal conductivity ($\lambda$layerN.av) determined by the equation (3) can be regarded as the parallel resistance of the conductor and the insulator, the coefficient of thermal conductivity $\lambda$ip of the interposer 3 may be determined by the following equation (4).

$$\lambda ip = (1/T) \cdot \Sigma Nt \cdot \lambda layerN.av \quad (4)$$

wherein T: thickness of interposer, and $\Sigma$Nt·$\lambda$layer.av: total value of thickness t×average coefficient of layer thermal conductivity $\lambda$layer.av for individual layers.

The substitution of the determined coefficient of thermal conductivity ($\lambda$ip) of the interposer in the equation (1) provides heat resistance (Rip).

Next, in the calculation of the heat resistance Rbga of the BGA bump 4, as with the calculation for the chip bump, for the thickness (height) t of the bump and the area A of the heat source, the same values as in the LSI chip 1 and the BGA bump 4 are used. On the other hand, the coefficient of thermal conductivity $\lambda$bga of the member is determined as the average coefficient of thermal conductivity ($\lambda$bga.av) from the area ratio of the BGA bump 4 and the underfill resin 5 by the following equation (5).

The substitution of the average coefficient of thermal conductivity ($\lambda$bga.av) in equation (1) can provide the heat resistance (Rbga) of the BGA bump 4 portion.

$$\lambda bga.av = \alpha bga \cdot \lambda bga + \alpha file \cdot \lambda file \quad (5)$$

wherein $\alpha$bga: occupation ratio of BGA bump, $\lambda$bga: coefficient of thermal conductivity of BGA bump, $\alpha$file: occupation ratio of underfill resin 5, and $\lambda$file: coefficient of thermal conductivity of underfill resin 5.

Next, the heat resistance (Rtvia) of the heat radiating vias 9 is calculated. As with the interposer 3, insulators and conductors are alternately stacked within the printed wiring board 6. Therefore, for the thickness (height) t of the heat radiating vias and the area A of the heat source, the same values as in the interposer 3 are used. On the other hand, for the coefficient of thermal conductivity of the member, the occupation ratio of the insulating layer (for example, FR4) and the occupation ratio of the heat radiating vias 9 or the multilayered wiring layer (for example, copper foil) are determined for each layer, followed by the determination of the average coefficient of thermal conductivity ($\lambda$layerN.av) for each layer by the following equation (6).

$$\lambda layerN.av = \alpha Cu \cdot \alpha Cu + \alpha FR4 \cdot \lambda FR4 \quad (6)$$

wherein $\alpha$Cu: occupation ratio of conductor, $\lambda$Cu: coefficient of thermal conductivity of conductor, $\alpha$FR4: occupation ratio of insulator, and $\lambda$FR4: coefficient of thermal conductivity of insulator.

Since the average coefficient of thermal conductivity $\lambda$layerN.av for each layer determined by the equation (6) can be regarded as the parallel resistance of the conductor and the insulator, the coefficient of thermal conductivity $\lambda$tvia of the heat radiating vias 9 may be calculated by the following equation (7).

$$\lambda ip = 1/T \cdot \Sigma Nt \cdot \lambda layerN.av \quad (7)$$

wherein T: thickness of heat radiating vias, and ΣNt·λlayerN.av: total value of thickness t×average coefficient of layer thermal conductivity λlayer.av for individual layers.

The substitution of the determined coefficient of thermal conductivity λtvia of heat radiating vias in the equation (1) can provide heat resistance Rtvia.

Next, the method for calculating the heat resistance of the heat sink 10b will be explained.

Calculation for the heat sink 10b embedded in the printed wiring board 6 may be carried out according to the equation (8). In the equation, the first term on the right side is the heat resistance of the heat sink 10b, and the second term is the heat resistance caused by a temperature rise of the coolant 14.

$$Rfin=(2/\lambda NuLW)\times(Wc/\alpha\eta)+(1/\rho Cpf) \qquad (8)$$

wherein λ: coefficient of thermal conductivity of coolant, Nu: Nusselt number, L: length of heat sink, W: width of heat sink, Wc: groove width of passage, α: area of contact with coolant/heat generation area, η: fin efficiency, ρ: density of coolant, Cp: specific heat of coolant, and f: flow rate of coolant.

For the coolant 14, which flows through the plurality of passages 11 provided within the heat sink 10, the pressure loss is not negligible. When the coolant 14 is flowed from a cooling pump provided outside of the structure through a piping tube into the heat sink 10b, the pressure loss comprises a friction loss PL1 caused between the coolant 14 and the wall surface of the fins 12 within the passages 11 and a local friction loss PL2 caused by a change in section of the passage. The whole pressure loss is determined by summing up these pressure losses.

At the outset, the friction loss PL1 caused by friction between the coolant 14 and the wall surface of the fins 12 is expressed by equation (9).

$$PL1=F(L/de)\times(\gamma/2g)v2 \qquad (9)$$

wherein F: coefficient of friction, de: equivalent hydraulic diameter, g: gravitational acceleration, γ: specific gravity of air, and v: flow rate of coolant.

The local loss (PL2) caused by a change in section of passage can be expressed by the following equation 10.

$$PL2=\zeta(\gamma/2g)v2 \qquad (10)$$

wherein v represents local coefficient.

For example, assuming that cooling of a power consumption of 50 W class in the LSI chip 1 is realized, the heat resistance caused by heat conduction (Rchip, Rcbmp, Rip, Rbga, and Rtvia) other than the heat resistance (Rfin) of the heat sink was calculated by experimental equations (1) to (3). The results are shown in Table 1 below.

As is apparent from Table 1, in this case, the total heat resistance is about 0.57° C./W (≠0.012+0.039+0.163+0.314+0.044) In order to realize cooling of a power consumption of 50 W class in the LSI chip 1, when the temperature rise is ΔT60° C. (ΔT=maximum temperature of LSI T1−cooling temperature T2), the heat resistance value should be brought to not more than 1.2° C./W. Since the heat resistance caused by heat conduction is 0.57° C./W, the heat resistance Rfin of the heat sink 10b embedded in the printed wiring board 6 should be brought to not more than 0.63° C./W. In this preferred embodiment, in the determination of the optimal value of the groove width Wc in the passage 11, the performance of the cooling pump used (1 atm: 100000 Pa, flow rate: 1 liter/min) was taken into consideration.

Figure 5:
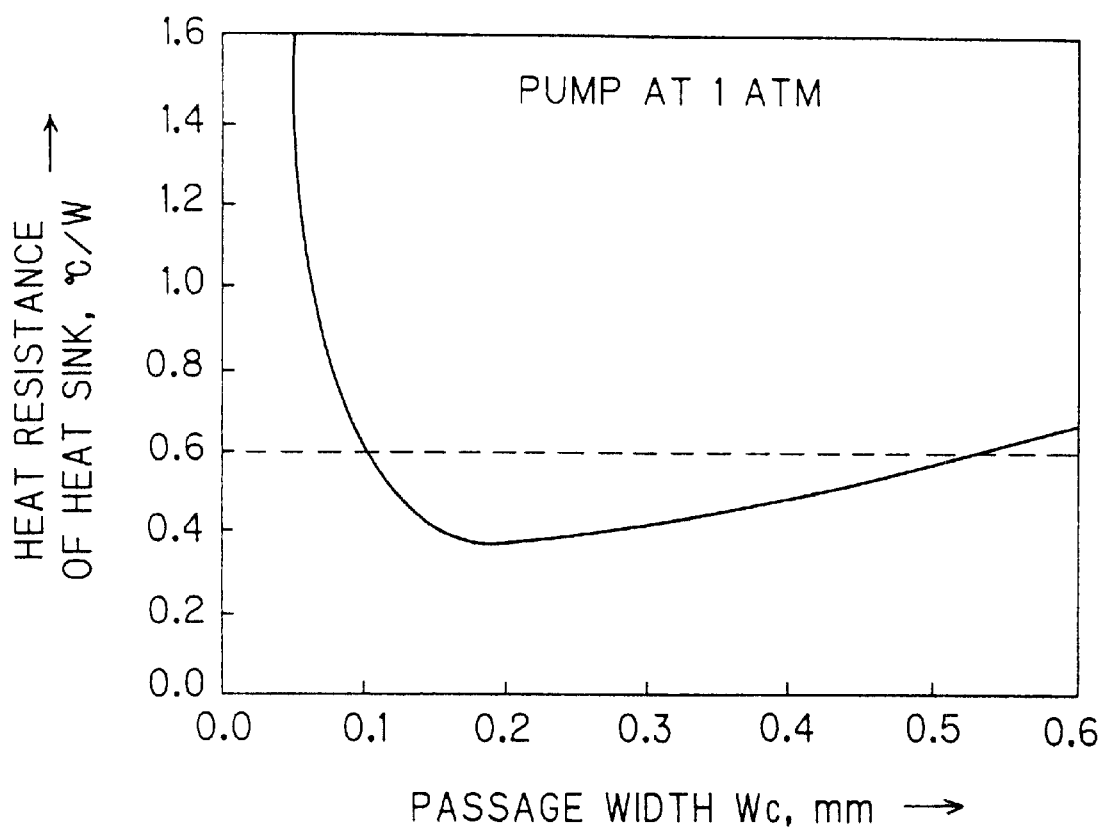
FIG. 5 is a characteristic diagram showing the cooling performance of a heat sink in the semiconductor device packaging structure according to the invention.

FIG. 5 shows the relationship between the groove width Wc of the passage 11 in the heat sink 10b and the heat resistance (Rfin) of the heat sink 10b based on the assumption that an identical cooling pump (1 atm pump) is used. As is apparent from FIG. 5, in the case of a groove width Wc of the passage 11 of 0.2 mm, when the above-described total heat resistance 0.57° C./w caused by heat conduction is included, the heat resistance (Rchip) of the LSI chip 1 is 0.95° C./W (=0.4° C./W+0.57° C./W), indicating that a power consumption of 60 W can be tolerated.

In the case of a groove width Wc of the passage 11 of about 0.5 mm, since the heat resistance (Rchip) of the LSI chip 1 is 1.2° C./W (which means that a power consumption of 50 W is tolerated), when the groove width Wc of the passage 11 is 0.2 to 0.5 mm, an LSI chip 1 having a power consumption of 50 W class can be mounted. Further, since the heat sink 10b is embedded in the printed wiring board 6, the package volume can be made much smaller than that of the conventional structure shown in FIG. 1. This can realize a reduction in size and a reduction in thickness of electronic equipment.

[Third preferred embodiment]

Figure 6:
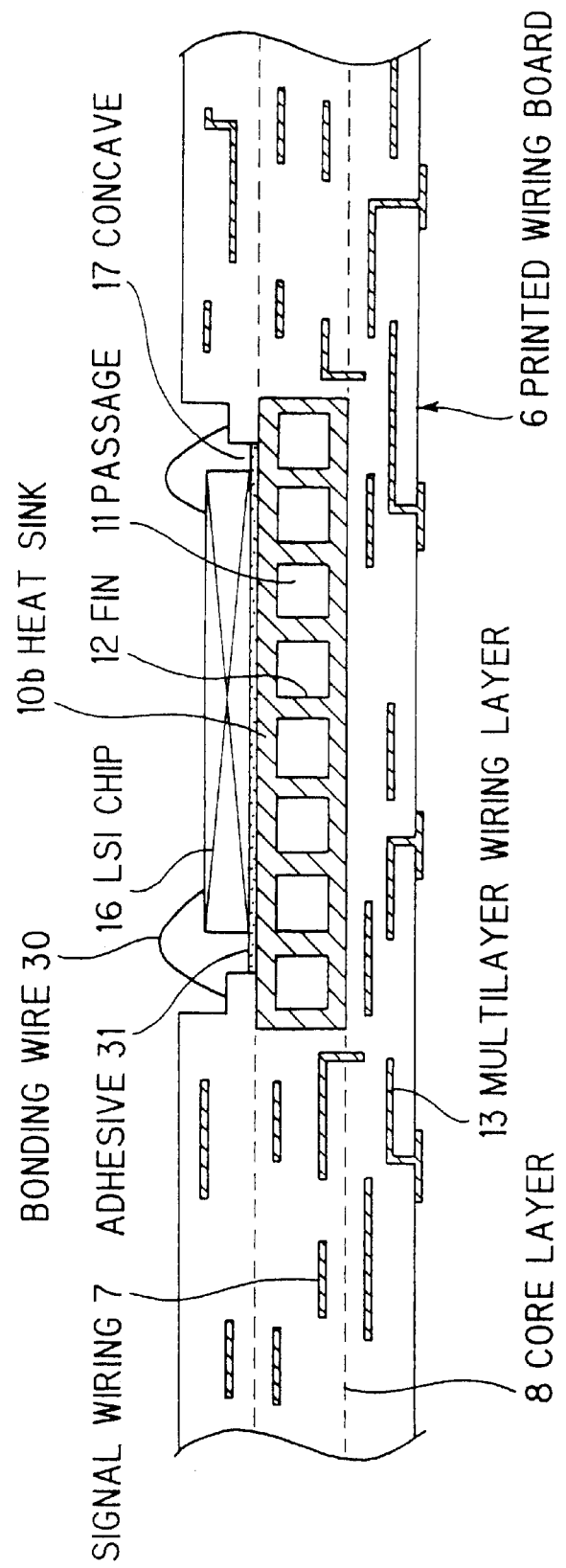
FIG. 6 is a cross-sectional view showing a third preferred embodiment of the semiconductor device packaging structure according to the invention.
Figure 7:
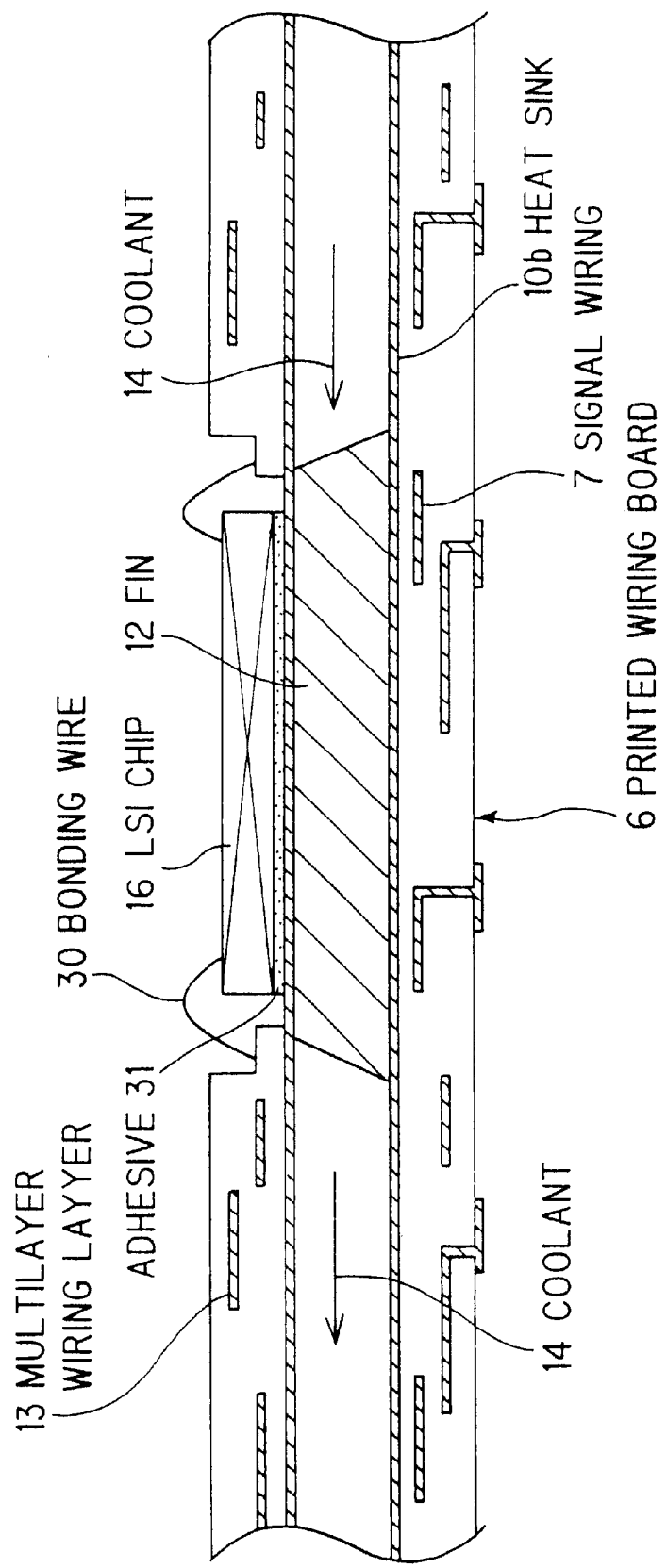
FIG. 7 is a transverse sectional view of the semiconductor device packaging structure in the third preferred embodiment shown in FIG. 6.

FIGS. 6 and 7 show a third preferred embodiment of the semiconductor device packaging structure of the invention, wherein FIG. 6 is a sectional view as viewed from the front direction and FIG. 7 a sectional view as viewed from the transverse direction. In FIGS. 3, 6, and 7, like members or elements having like functions are identified with the same reference numerals.

The semiconductor device packaging structure in this preferred embodiment is characterized in that the package structure as shown in FIG. 3 is not used and a face-up-type LSI chip 16, in which the element surface faces upward, is used instead of the LSI chip 1. Accordingly, in the printed wiring board 6, a concave 17, for mounting the LSI chip 16, having a depth large enough to embed the LSI chip 16 therein is provided in a portion which faces the heat sink 10b. The LSI chip 16 is mounted in the concave 17 through an adhesive 31. The LSI chip 16 in its electrode pad (not shown) is electrically connected through a bonding wire 30

TABLE 1

|  | Thickness member t, m | Heat source area A, m² | Coefficient of thermal conductivity λ, W/mk | Occupation ratio of conductor, % | Heat resistance, ° C./W |
|---|---|---|---|---|---|
| LSI chip | 0.00035 | 0.000196 | 150 | * | 0.012 |
| Chip bump | 0.00005 | 0.000196 | 6.49 | 15 | 0.039 |
| Interposer | 0.0008 | 0.000196 | 25.1 | * | 0.163 |
| BGA bump | 0.0004 | 0.000196 | 6.49 | 15 | 0.314 |
| Heat radiating via | 0.0005 | 0.000196 | 58.09 | 15 | 0.044 | to a connection pad (not shown) provided in the printed wiring board 6 in its cavity portion. The other portions in the structure are identical to those shown in FIG. 3, and the overlapped explanation thereof will be omitted. In this preferred embodiment, the LSI chip 16 is connected to the printed wiring board 6 through the bonding wire 30. Alternatively, the connection may be carried out by the TAB (tape automated bonding) method.

In the third preferred embodiment, as compared with the second preferred embodiment, heat generated in the LSI chip 1 is conveyed more directly to the heat sink 10b through the adhesive 31. Therefore, unlike the second preferred embodiment, the resistance of the BGA bump 4, the interposer 3 and the like does not exist. This enables efficient transfer of a large quantity of heat. Therefore, the heat resistance of the LSI chip (Rtot) in the third preferred embodiment can be expressed as the sum of the heat resistance of the heat sink 10b (Rfin) and the heat resistance of the LSI chip 1 and the adhesive 31 (Rgrease).

$$Rtot = Rfin + Rgrease \tag{11}$$

The heat resistance of the heat sink (Rfin) and the heat resistance of the adhesive (Rgrease) can be calculated by equations (8) and (1).

Table 2 shows the results of calculation of the cooling performance in the third preferred embodiment shown in FIGS. 6 and 7.

TABLE 2

| | Thickness of member t, m | Heat source area A, m² | Coefficient of thermal conductivity λ, W/mk | Heat resistance, °C./W |
|---|---|---|---|---|
| LSI chip | 0.00035 | 0.000196 | 150 | 0.012 |
| Adhesive | 0.00005 | 0.000196 | 1.1 | 0.232 |

When the groove width Wc of the passage 11 in the heat sink 10b is 0.2 mm, as can be seen from FIG. 5, the heat resistance is 0.38° C./W. The heat resistance of the LSI chip 16 (Rchip) and the heat resistance of the adhesive 31 (Rgrease) shown in Table 2 are added to this heat resistance value to give a heat resistance of the LSI chip 16 (Rtot) of 0.62° C./W (=0.38° C./W+0.24° C./W), indicating that an LSI chip 16 corresponding to a power consumption of 95 W can be mounted. On the other hand, when the groove width Wc of the passage 11 is 0.6 mm, as can be seen from FIG. 5, the heat resistance of the heat sink 10b (Rfin) is about 0.7° C./W. The heat resistance of the LSI chip 16 (Rchip) and the heat resistance of the adhesive (Rgrease) are added to this heat resistance value to give a heat resistance of the LSI chip (Rtot) of about 1° C./W, indicating that an LSI chip 16 corresponding to a power consumption of 60 W can be mounted.

Thus, in the third preferred embodiment, as compared with the first and second preferred embodiments, an LSI chip having a larger power consumption can be mounted. Further, in the structure according to this preferred embodiment, the heat sink 10b is embedded in the printed wiring board 6 in its concave portion 17. By virtue of this structure, the package volume can be made much smaller than that of the conventional package structure shown in FIG. 1. This can realize a reduction in size and a reduction in thickness of electronic equipment.

[Fourth preferred embodiment]

Figure 8:
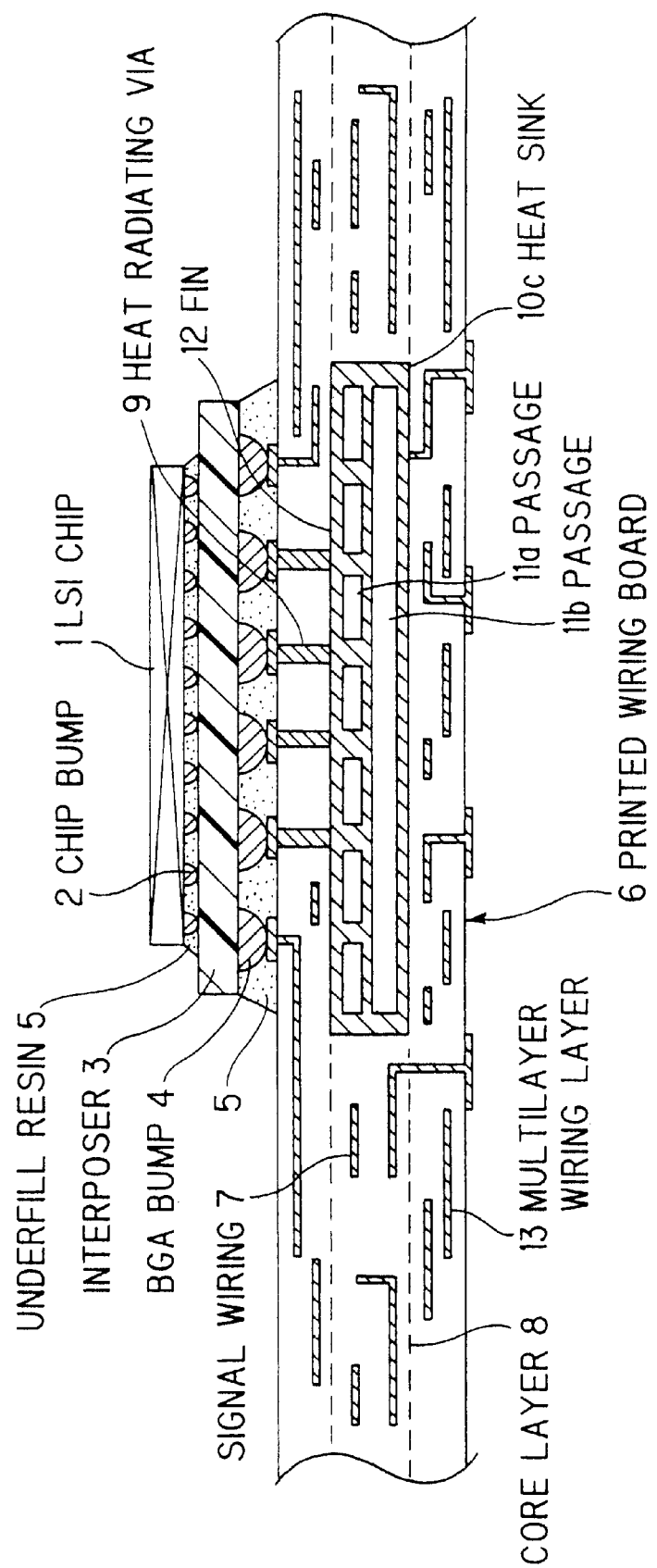
FIG. 8 is a cross-sectional view showing a fourth preferred embodiment of the semiconductor device packaging structure according to the invention.
Figure 9:
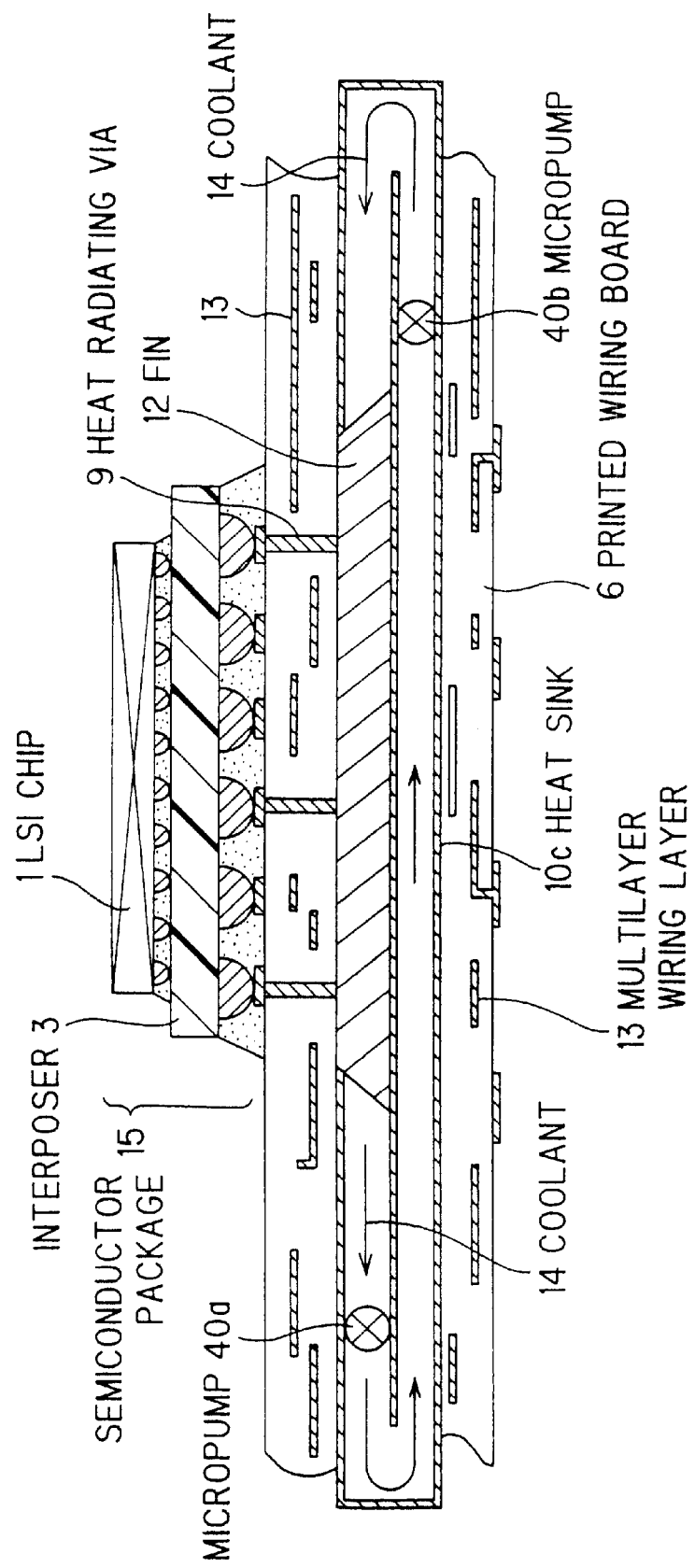
FIG. 9 is a transverse sectional view of the semiconductor device packaging structure in the fourth preferred embodiment shown in FIG. 8.

FIGS. 8 and 9 show a fourth preferred embodiment of the semiconductor device packaging structure according to the invention. Also in this preferred embodiment, the same members as used in the above preferred embodiments are identified with the same reference numerals, and the overlapped explanation thereof will be omitted.

This preferred embodiment is different from the second preferred embodiment in the structure of a heat sink 10c embedded in the printed wiring board 6. Specifically, as shown in FIG. 8, the heat sink 10c has a two-stage structure comprising an upper passage 11a and a lower passage 11b. As shown in FIG. 9, both ends of the heat sink 10c are closed, and micropumps 40a, 40b (thickness (height): not more than 0.6 mm) (two micropumps in the drawing) are incorporated respectively into the upper passage 11a and the lower passage 11b. Upon the operation of the micropumps 40a, 40b, the coolant 14 sealed in the heat sink 10c is circulated through the heat sink 10c in a direction indicated by an arrow in the drawing and is heat exchanged with the fins 12. Therefore, the coolant 14 having an increased temperature is moved, and the coolant 14 having a low temperature is fed to a portion around the fins 12. Heat radiating fins (not shown) are connected to the end of the heat sink 10c. The other construction is the same as that in the second preferred embodiment.

When the adoption of the structure as shown in FIGS. 8 and 9 can make the capacity of the built-in micropumps 40a, 40b and the heat exchange capacity of the heat radiating fins (not shown) connected onto an extension of the heat sink 10c identical to those of the second preferred embodiment and, at the same time, when the same resistances of the semiconductor package 15, the heat radiating vias 9 and the like are adopted, the adoption of a groove width Wc of the passage 11a of 0.2 to 0.5 mm can realize mounting of an LSI chip corresponding to a power consumption of 50 W in the semiconductor device packaging structure in the fourth preferred embodiment of the invention.

Further, since the coolant 14 is circulated in a closed system within the heat sink, unlike the construction of the second and third preferred embodiments wherein the coolant 14 is fed into/discharged from the external cooling pump, there is no piping portion for connection to the outside of the system. This can avoid a problem of liquid leakage or the like and can realize high reliability. Further, in the structure according to this preferred embodiment, the heat sink 10c is embedded in the printed wiring board 6. By virtue of this structure, the package volume can be made much smaller than that of the conventional construction shown in FIG. 13. This can realize a reduction in size and a reduction in thickness of electronic equipment.

[Fifth preferred embodiment]

Figure 10:
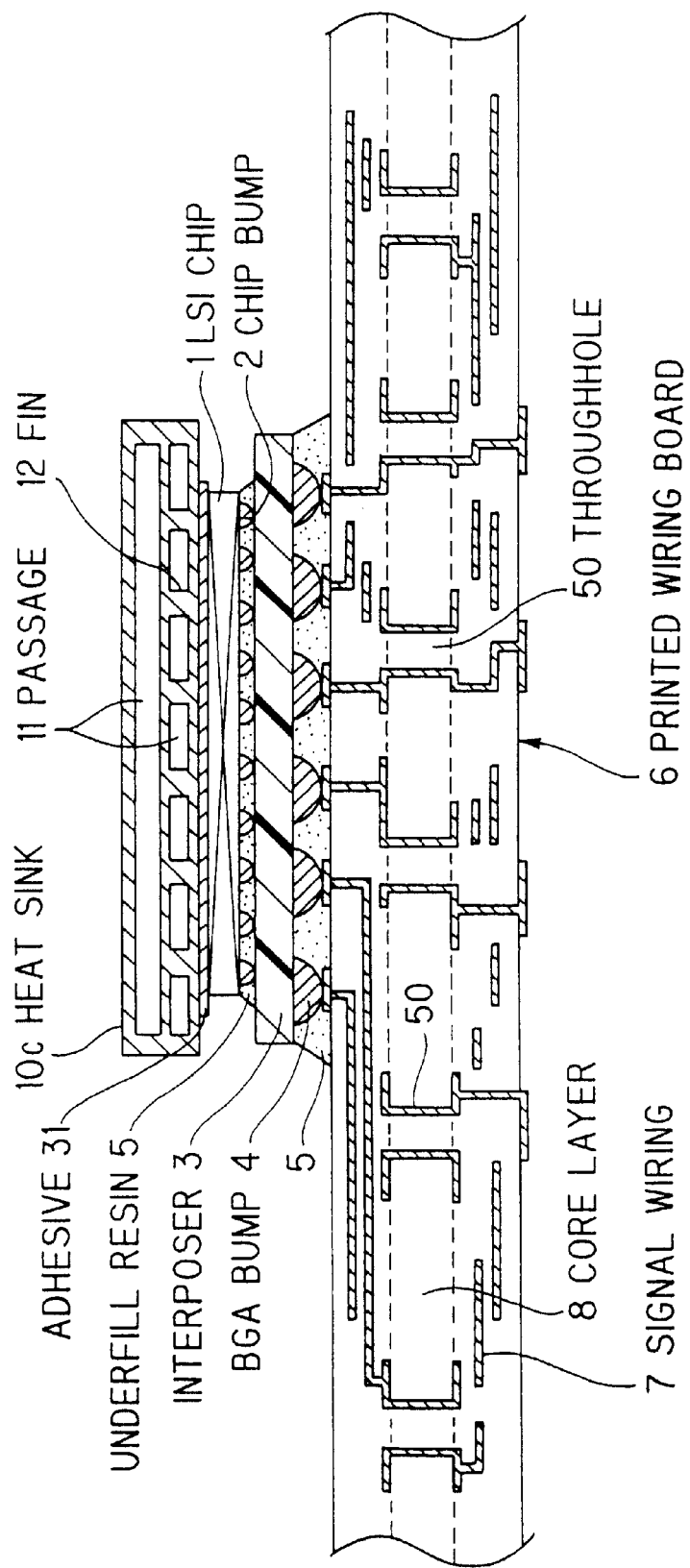
FIG. 10 is a cross-sectional view showing a fifth preferred embodiment of the semiconductor device packaging structure according to the invention.
Figure 11:
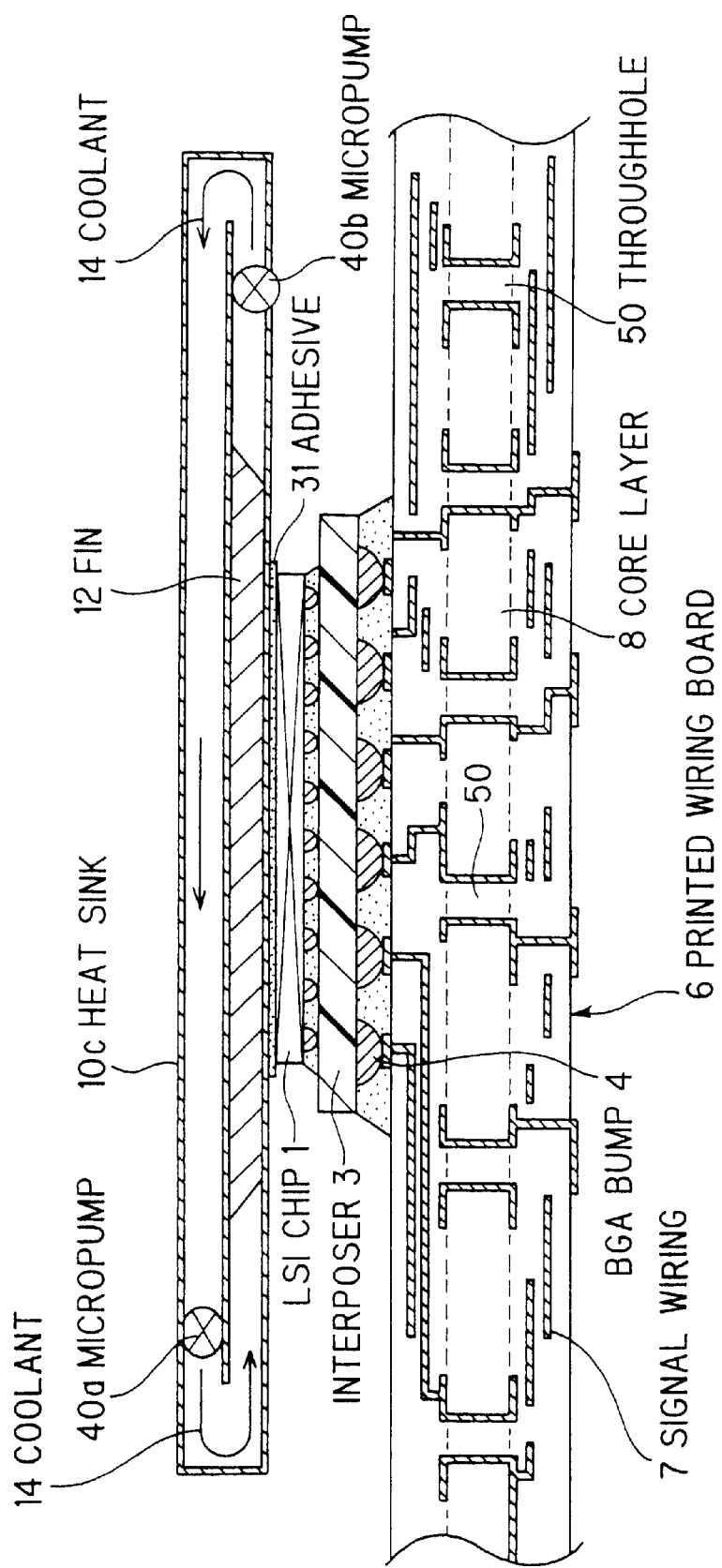
FIG. 11 is a transverse sectional view of the semiconductor device packaging structure in the fifth preferred embodiment shown in FIG. 10.

FIGS. 10 and 11 show a fifth preferred embodiment of the semiconductor device packaging structure according to the invention. Also in this preferred embodiment, the same members as used in the above preferred embodiments are identified with the same reference numerals, and the overlapped explanation thereof will be omitted.

In this preferred embodiment, a heat sink 10c having the same structure as shown in FIGS. 8 and 9 is used. The heat sink in the fifth preferred embodiment, however, is different from the heat sink in the fourth preferred embodiment in installation site. Specifically, in the fifth preferred embodiment, the heat sink 10c is not provided within the printed wiring board 6 but is provided at a site where the heat radiator 70 is provided in the conventional construction shown in FIG. 1. The heat sink 10c is provided on the backside of the LSI chip 1 in the semiconductor package 15 mounted on the printed wiring board 6 through an adhesive 31. Therefore, as with the third preferred embodiment, heat generated in the LSI chip 1 is conveyed directly to the heat sink 10c through the adhesive 31. This enables a larger quantity of heat to be dissipated than that in the fourth preferred embodiment. Since the restriction in the thicknesswise direction is smaller than that in the above preferred embodiments, the adoption of a large thickness (that is, a larger sectional area) can enhance the cooling capacity.

According to the fifth preferred embodiment shown in FIGS. 10 and 11, when the cooling capacity (heat exchange capacity) is made identical to that in the third preferred embodiment and, at the same time, when the resistance of the adhesive 31 is made identical, the adoption of a groove width Wc of the passage 11a in the heat sink 10c of 0.2 to 0.5 mm permits an LSI chip 1 corresponding to a power consumption of 60 to 95 W to be mounted. Further, since the coolant 14 is sealed in the heat sink and is circulated in a closed system, as compared with the second and third preferred embodiments, a problem of liquid leakage or the like does not occur and, thus, the reliability is higher. Furthermore, since the package volume can be made much smaller than that in the conventional construction shown in FIG. 1, a reduction in size and a reduction in thickness of electronic equipment can be realized. In addition, since the capacity of wiring accommodation of signal wiring in the printed wiring board 6 is higher than that in the above preferred embodiments, packaging at a higher density can be realized.

[Sixth preferred embodiment]

Figure 12:
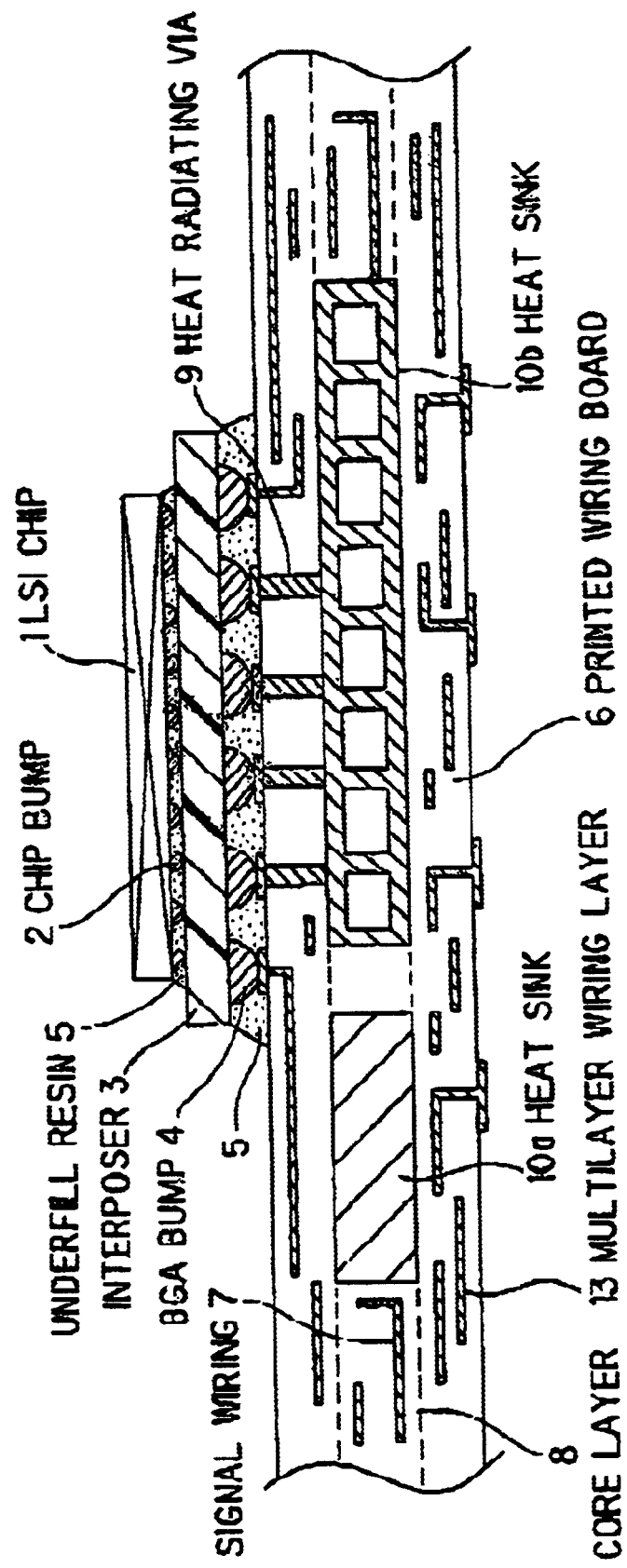
FIG. 12 is a cross-sectional view showing a sixth preferred embodiment of the semiconductor device packaging structure according to the invention.

FIG. 12 shows a sixth preferred embodiment of the semiconductor device packaging structure according to the invention. In FIGS. 2, 3, and 12, like members or elements having like functions are identified with the same reference numerals, and the overlapped explanation thereof will be omitted.

This preferred embodiment is characterized in that two types of heat sinks, that is, the heat sink 10a having the structure shown in FIG. 2 and the heat sink 10b having the structure shown in FIGS. 3 and 6, are selectively provided on an identical plane within the core layer 8. The heat sink 10a is formed of a highly heat-conductive metal material, for example, copper or aluminum, in a thickness of 0.1 to 1 mm so as to be housed within the printed wiring board 6. The heat sink 10a may be of an embedded type in which the heat sink 10a is built in the printed wiring board 6 and is not exposed to the outside of the printed wiring board 6. Alternatively, heat sink 10a may be of a type in which a predetermined length of the end of the heat sink 10a is projected from the end of the printed wiring board 6 to the outside of the printed wiring board 6, or a type in which a heat radiator is provided in the projected portion. The heat sink 10b has a thickness of not less than 0.8 mm, and a plurality of fine passages 11 are provided within the heat sink 10b. Heat radiating vias 9, to which BGA bumps 4 of GND potential (or Vcc potential) have been selectively connected, are connected to the heat sink 10b.

According to this structure, heat generated from the LSI chip 1 is conveyed through a route of LSI chip 1→chip bump 2→interposer 3→BGA bump 4→printed wiring board 6→heat sink 10a, 10b. In particular, heat from the BGA bump 4 is conveyed directly to the heat sink 10b through heat radiating vias 9 provided within the printed wiring board 6. Therefore, heat is efficiently conveyed to the coolant 14 within the heat sink 10b. This permits an LSI chip 1 having large power consumption to be mounted.

In the above preferred embodiment, the heat sink is provided within the core layer 8. The site, in which the heat sink is provided, however, is not limited to the core layer 8 and may be provided in a portion near the surface or near the backside within the printed wiring board 6. In the heat sinks 10b, 10c, the sectional form of the passages 11, 11a, 11b is angular. Alternatively, the sectional form may be circular. Further, although a flat heat radiation surface has been adopted in the heat sinks 10a to 10c, a construction may be adopted wherein the heat radiating surface has irregularities or has grooves provided at predetermined intervals. Likewise, the inner wall of the passage 11 may be provided with projections, fins, spiral grooves or the like which create a turbulent flow in the coolant 14 or increase heat exchange area for realizing efficient heat exchange.

In the above preferred embodiments, LSI is used as the semiconductor device. In the invention, however, the semiconductor device is not limited to LSI, and, for example, semiconductor devices having remarkably high heat generation power, such as laser elements and power supply ICs, may also be used. The use of the heat sink 10c having the structure shown in FIGS. 8 and 9 instead of the heat sink 10b shown in FIGS. 6 and 7 is possible. The application of the layout structure of the heat sinks 10a and 10b shown in FIG. 12 to the structure shown in FIG. 2 or FIG. 6 is also possible. Further, the use of the heat sink 10b shown in FIG. 6 instead of the heat sink 10c shown in FIGS. 10 and 11 is possible.

As described above, in the semiconductor device packaging structure according to the first feature of the invention, a heat sink is provided within a printed wiring board, and a plurality of metallic columns, which contact the heat sink, the semiconductor chip-side bump and the like to perform heat link, are built in the printed wiring board. By virtue of this structure, mutual spacing between semiconductor chips involved in the occupation of space by the heat sink can be reduced, and this permits heat conduction to be achieved by the plurality of metallic columns even in the case where the heat sink is not in close contact with the semiconductor chip. Consequently, unlike the conventional construction wherein, due to the mounting of a large heat sink, mutual spacing between semiconductor chips on the printed wiring board is large resulting in large signal wiring length, in the invention, the signal wiring length between semiconductor chips can be reduced and, thus, attenuation or delay time in the signal transmission can be reduced. Further, cooling of the heat sink with a coolant can realize a reduction in size and a reduction in thickness of the heat sink.

In the semiconductor device packaging structure according to the second feature of the invention, in a printed wiring board, a heat sink is provided, and, in addition, a concave portion for exposing the heat sink is provided. A semiconductor chip is provided within the concave portion and is packaged so as to be in close contact with the heat sink. By virtue of this construction, the provision of the heat sink within a space can be avoided, and any restriction on the arrangement of a heat radiator, an electronic component and the like in other semiconductor chip on the same substrate is not imposed. Therefore, unlike the conventional construction wherein, due to the mounting of a large heat sink within a space, mutual spacing between semiconductor chips on the printed wiring board is large resulting in large signal wiring length, according to the invention, the signal wiring length between semiconductor chips can be reduced and, thus, attenuation or delay time in the signal transmission can be reduced. Further, cooling of the heat sink with a coolant can realize a reduction in size and a reduction in thickness of the heat sink.

In the semiconductor device packaging structure according to the third feature of the invention, a heat sink, within which at least one passage for permitting the flow of a cooling medium therethrough is provided, is mounted on the heat radiating surface of a semiconductor chip mounted on the printed wiring board. By virtue of this structure, the heat exchange capacity of the heat sink can be enhanced by the sealed cooling medium. This can realize a reduction in size. Further, unlike the conventional construction wherein, due to the mounting of a large heat sink, mutual spacing between semiconductor chips on the printed wiring board is large resulting in large signal wiring length, in the invention, the signal wiring length between semiconductor chips can be reduced and, thus, attenuation or delay time in the signal transmission can be reduced.

The invention has been described in detail with particular reference to preferred embodiments, but it will be understood that variations and modifications can be effected within the scope of the invention as set forth in the appended claims.

What is claimed is:

1. A semiconductor device packaging structure comprising: a printed wiring board having multilayered wirings; and an LSI chip mounted at a predetermined position of the printed wiring board,
    wherein the printed wiring board is provided with a heat sink at a site remote from the semiconductor chip, and wherein a plurality of metallic columns, which contact the heat sink and a metallic portion on the semiconductor chip side to perform heat link, are built in the printed wiring board, said heat sink being located entirely within the printed wiring board, and said heat sink being at least one of: a plate form and a structure having a least two flow passages partitioned by at least one fin.

2. The semiconductor device packaging structure according to claim 1, wherein the heat sink is provided in a core layer in the printed wiring board.

3. The semiconductor device packaging structure according to claim 1 or 2, wherein at least one passage for permitting the flow of a cooling medium therethrough is provided in the heat sink and the cooling medium is externally fed into the passage.

4. The semiconductor device packaging structure according to claim 3, wherein the passage has a width of 0.2 to 0.6 mm.

5. The semiconductor device packaging structure according to claim 1 or 2, wherein a cooling medium is sealed in the heat sink, the heat sink has first and second passages through which the cooling medium is returned, and at least one micropump for circulating the cooling medium is built in the heat sink.

6. The semiconductor device packaging structure according to claim 5, wherein the micropump is installed within the first or second passage and has a height of not more than 0.6 mm.

7. The semiconductor device packaging structure according to claim 1 or 2, wherein the heat sink is in a plate form.

8. The semiconductor device packaging structure according to claim 1 or 2, wherein the heat sink comprises selectively provided two heat sinks, a first heat sink in a plate form and a second heat sink having at least one passage for passing a cooling medium therethrough.

9. The semiconductor device packaging structure according to claim 7, wherein the heat sink has a thickness of 0.1 to 1 mm.

10. The semiconductor device packaging structure according to claim 1, wherein the semiconductor chip is of a flip chip type.

11. A semiconductor device packaging structure comprising: a printed wiring board having multilayered wirings; and a semiconductor chip mounted at a predetermined position of the printed wiring board,
    wherein the printed wiring board is provided with a heat sink at a site remote from the semiconductor chip and has a concave portion for exposing the heat sink, and wherein the semiconductor chip is mounted within the concave portion in such a state that the heat radiating surface of the semiconductor chip is in close contact with the heat sink, said heat sink being provided entirely within said printed wiring board.

12. The semiconductor device packaging structure according to claim 11, wherein the semiconductor chip is fixed to the heat sink with the aid of a heat-conductive adhesive.

13. The semiconductor device packaging structure according to claim 11, wherein at least one passage for permitting the flow of a cooling medium therethrough is provided in the heat sink and the cooling medium is externally fed into the passage.

14. The semiconductor device packaging structure according to claim 13, wherein the passage has a width of 0.2 to 0.6 mm.

15. The semiconductor device packaging structure according to claim 11, wherein the heat sink is in a plate form.

16. The semiconductor device packaging structure according to claim 11, wherein a cooling medium is sealed in the heat sink, the heat sink has first and second passages through which the cooling medium is returned, and at least one micropump for circulating the cooling medium is built in the heat sink.

17. The semiconductor device packaging structure according to claim 16, wherein the micropump is installed within the first or second passage and has a height of not more than 0.6 mm.

18. The semiconductor device packaging structure according to claim 11, 13, or 16, wherein the heat sink has a thickness of 0.1 to 1 mm.

19. A semiconductor device packaging structure comprising: a printed wiring board having multilayered wirings; and a semiconductor chip mounted at a predetermined position of the printed wiring board, wherein
    a heat sink having in its interior at least an upper passage and a lower passage for passing a cooling medium therethrough is mounted on the heat radiating surface of the semiconductor chip.

20. The semiconductor device packaging structure according to claim 19, wherein a cooling medium is sealed in the heat sink, the cooling medium is returned through said upper and lower passages, and at least one micropump for circulating the cooling medium is built in the heat sink.

21. The semiconductor device packaging structure according to claim 20, wherein the micropump is installed within the first or second passage and has a height of not more than 0.6 mm.

22. The semiconductor packaging structure of claim 20, further comprising a first micropump located in said upper passage and a second micropump located in said lower passage.

23. The semiconductor packaging structure of claim 21, wherein one of the upper passage and the lower passage is partitioned by fins.

* * * * *